(12) United States Patent
Schellhammer et al.

(10) Patent No.: US 9,362,259 B2
(45) Date of Patent: Jun. 7, 2016

(54) DISCONTINUOUS PATTERNED BONDS FOR SEMICONDUCTOR DEVICES AND ASSOCIATED SYSTEMS AND METHODS

(71) Applicant: Micron Technology, Inc., Boise, ID (US)

(72) Inventors: Scott D. Schellhammer, Meridian, ID (US); Vladimir Odnoblyudov, Eagle, ID (US); Jeremy S. Frei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/738,663

(22) Filed: Jun. 12, 2015

(65) Prior Publication Data

US 2015/0357314 A1    Dec. 10, 2015

Related U.S. Application Data

(60) Continuation of application No. 14/305,387, filed on Jun. 16, 2014, now Pat. No. 9,059,380, which is a division of application No. 13/220,462, filed on Aug. 29, 2011, now Pat. No. 8,754,424.

(51) Int. Cl.
*H01L 25/075* (2006.01)
*H01L 33/00* (2010.01)
(Continued)

(52) U.S. Cl.
CPC .......... *H01L 25/0753* (2013.01); *H01L 21/187* (2013.01); *H01L 21/2007* (2013.01); *H01L 21/447* (2013.01); *H01L 23/49513* (2013.01); *H01L 24/04* (2013.01); *H01L 24/06* (2013.01); *H01L 24/83* (2013.01); *H01L 24/94* (2013.01); *H01L 24/97* (2013.01);
(Continued)

(58) Field of Classification Search
None
See application file for complete search history.

(56) References Cited

U.S. PATENT DOCUMENTS 7,829,909 B2    11/2010   Yoo
9,059,380 B2 *   6/2015   Schellhammer ........ H01L 24/94
(Continued)

FOREIGN PATENT DOCUMENTS

JP    11186670       7/1999
JP    11186670 A    7/1999
(Continued)

OTHER PUBLICATIONS

Office Action issued Nov. 18, 2014 in Taiwan Application No. 101130522, 16 pages.
(Continued)

*Primary Examiner* — Yasser A Abdelaziez
(74) *Attorney, Agent, or Firm* — Perkins Coie LLP

(57) ABSTRACT

Discontinuous bonds for semiconductor devices are disclosed herein. A device in accordance with a particular embodiment includes a first substrate and a second substrate, with at least one of the first substrate and the second substrate having a plurality of solid-state transducers. The second substrate can include a plurality of projections and a plurality of intermediate regions and can be bonded to the first substrate with a discontinuous bond. Individual solid-state transducers can be disposed at least partially within corresponding intermediate regions and the discontinuous bond can include bonding material bonding the individual solid-state transducers to blind ends of corresponding intermediate regions. Associated methods and systems of discontinuous bonds for semiconductor devices are disclosed herein.

20 Claims, 6 Drawing Sheets

(51) Int. Cl.
  *H01L 23/00* (2006.01)
  *H01L 21/18* (2006.01)
  *H01L 21/20* (2006.01)
  *H01L 21/447* (2006.01)
  *H01L 23/495* (2006.01)
  *H01L 33/48* (2010.01)
  *H01L 33/62* (2010.01)

(52) U.S. Cl.
  CPC ....... *H01L 33/0066* (2013.01); *H01L 33/0079* (2013.01); *H01L 33/486* (2013.01); *H01L 33/62* (2013.01); *H01L 24/32* (2013.01); *H01L 33/0095* (2013.01); *H01L 2224/32225* (2013.01); *H01L 2224/32245* (2013.01); *H01L 2224/83001* (2013.01); *H01L 2224/8314* (2013.01); *H01L 2224/83121* (2013.01); *H01L 2224/83193* (2013.01); *H01L 2924/12041* (2013.01); *H01L 2924/12042* (2013.01)

(56) References Cited

U.S. PATENT DOCUMENTS

| | | |
|---|---|---|
| 2004/0157407 A1 | 8/2004 | Tong et al. |
| 2005/0173711 A1 | 8/2005 | Patel et al. |
| 2007/0210702 A1 | 9/2007 | Nakamura |
| 2008/0179611 A1 | 7/2008 | Chitnis et al. |
| 2009/0224272 A1 | 9/2009 | Yu et al. |
| 2009/0267085 A1 | 10/2009 | Lee et al. |
| 2010/0244071 A1 | 9/2010 | Wada et al. |
| 2011/0001120 A1 | 1/2011 | Jiang et al. |
| 2011/0003410 A1 | 1/2011 | Tsay et al. |
| 2011/0193105 A1 | 8/2011 | Lerman et al. |
| 2013/0049016 A1 | 2/2013 | Schellhammer et al. |
| 2014/0295594 A1 | 10/2014 | Schellhammer et al. |

FOREIGN PATENT DOCUMENTS

| | | |
|---|---|---|
| JP | 2007095413 | 4/2007 |
| JP | 2007095414 | 4/2007 |
| WO | 2010020066 | 2/2010 |
| WO | 2010020071 | 2/2010 |

OTHER PUBLICATIONS

Extended European Search Report mailed Mar. 12, 2015 in European Application No. 12827286.1, 7 pages.

International Search Report and Written Opinion issued Feb. 28, 2013 in International Application No. PCT/US2012/050768, 11 pages.

Office Action mailed Jan. 28, 2015 in Korean Patent Application No. 10-2014-7008174, 10 pages.

\* cited by examiner

DISCONTINUOUS PATTERNED BONDS FOR SEMICONDUCTOR DEVICES AND ASSOCIATED SYSTEMS AND METHODS

CROSS-REFERENCE TO RELATED APPLICATION

This application is a continuation of U.S. application Ser. No. 14/305,387, filed Jun. 16, 2014, now U.S. Pat. No. 9,059,380, which is a divisional of U.S. application Ser. No. 13/220,462 filed Aug. 29, 2011, now U.S. Pat. No. 8,754,424, each of which is incorporated herein by reference.

TECHNICAL FIELD

The present technology is directed generally to discontinuous bonds for semiconductor devices, and associated systems and methods. Discontinuous bonds in accordance with the present technology are suitable for solid-state transducers, including light-emitting diodes.

BACKGROUND

Solid state transducer devices include light-emitting diodes ("LEDs"), organic light emitting diodes ("OLEDs"), and polymer light-emitting diodes ("PLEDS"). The energy efficiency and small size of solid state transducer devices has led to the proliferation of these devices in a multitude of products. Televisions, computer monitors, mobile phones, digital cameras, and other electronic devices utilize LEDs for image generation, object illumination (e.g., camera flashes) and/or backlighting. LEDs are also used for signage, indoor and outdoor lighting, traffic lights, and other types of illumination. Improved fabrication techniques for these semiconductor devices have both lowered device cost and increased device efficiency.

Manufacturing processes for solid-state transducer devices and other semiconductor devices often include the use of multiple substrates. In one conventional method, semiconductor fabrication techniques are used to construct LEDs on a device substrate. A bonding material is then used to bond the device substrate to a carrier substrate, with the LEDs sandwiched therebetween. The device substrate can then be removed and the carrier substrate with the attached LEDs can be further processed to singulate individual LEDs.

Although this fabrication method can yield reasonable results, the bonding process can produce significant stresses on the substrates and the attached LEDs. These stresses can flex and bow the substrates causing, warping, delamination or other separations, and/or can lead to misalignments during the singulation process. Additionally, singulating the LEDs through both the bonding material and the substrate can create significant stresses and complicate the singulation process. Accordingly, there is a need for a solid-state transducer device and a method of fabrication that can avoid these limitations.

DETAILED DESCRIPTION

Specific details of several embodiments of wafer-level assemblies for semiconductor devices and associated systems and methods are described below. The embodiments below include solid-state transducers ("SSTs"). However, other embodiments of the presently disclosed technology may include other semiconductor devices, such as photocells, diodes, transistors, integrated circuits, etc. The term "SST" generally refers to solid-state devices that include a semiconductor material as the active medium to convert electrical energy into electromagnetic radiation in the visible, ultraviolet, infrared, and/or other spectra. For example, SST devices include solid-state light emitters (e.g., LEDs, laser diodes, etc.) and/or other sources of emission other than electrical filaments, plasmas, or gases. The term SST can also include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 1-13.

Figure 1:
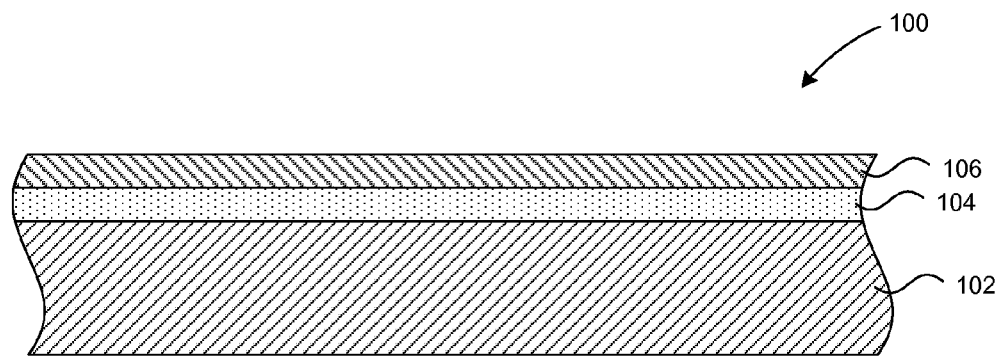
FIG. 1 is a partially schematic, cross-sectional diagram of a portion of a device assembly configured in accordance with an embodiment of the present technology.
Figure 2:
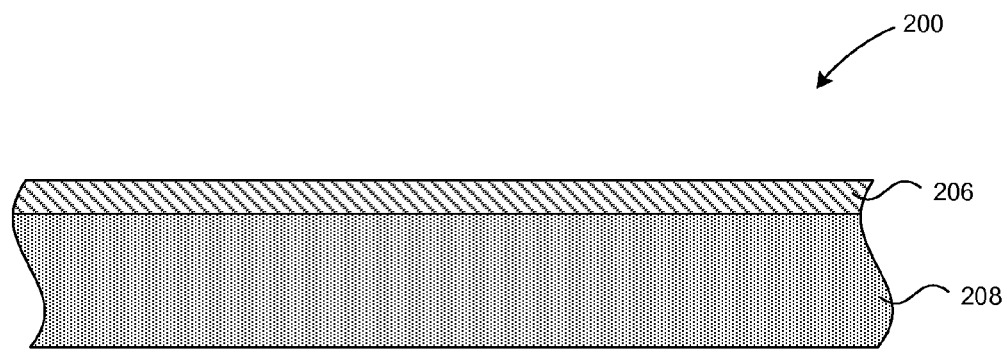
FIG. 2 is a partially schematic, cross-sectional diagram of a portion of a carrier assembly configured in accordance with an embodiment of the present technology.

FIG. 1 is a partially schematic, cross-sectional diagram of a portion of a wafer-level assembly, or device assembly 100 having a device substrate 102, a transducer structure 104 and a first bond metal 106 in accordance with an embodiment of the present technology. FIG. 2 is a partially schematic, cross-sectional diagram of a portion of a wafer-level assembly, or carrier assembly 200, having a carrier substrate 208 and a second bond metal 206 in accordance with an embodiment of the present technology. The wafer-level assemblies of FIGS. 1 and 2 may be constructed using various semiconductor fabrication techniques. The device substrate 102 and the carrier substrate 208, for example, can be made from silicon, polycrystalline aluminum nitride, sapphire, and/or other suitable materials including both metals and non-metals. Additionally, the device substrate 102 and/or the earlier substrate 208 may be a composite substrate or an engineered substrate. In such embodiments, the engineered substrate may include two or more materials bonded together, and/or materials chosen or engineered to improve fabrication or assembly of the device assembly 100 or carrier assembly 200. The transducer structure 104 can be formed via a variety of processes, including metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the transducer structure 104 may be formed using other suitable techniques, e.g., epitaxial growth techniques. The first bond metal 106 and the second bond metal 206 of FIGS. 1 and 2 may be composed of any of a variety of suitable metals including copper, aluminum, gold, tin, nickel, palladium, indium, and/or various alloys including combinations of these and/or other metals. In some embodiments, the first bond metal 106 and the second bond metal 206 may be composed of the same metal or alloy. In other embodiments, the first bond metal 106 and the second bond metal 206 may be composed of different metals or alloys. Furthermore, in yet other embodiments, a bonding material other than a metal may be used in place of the bond metals 106 and 206. Various semiconductor adhesives, for example, may be used as a bonding material.

Figure 3:
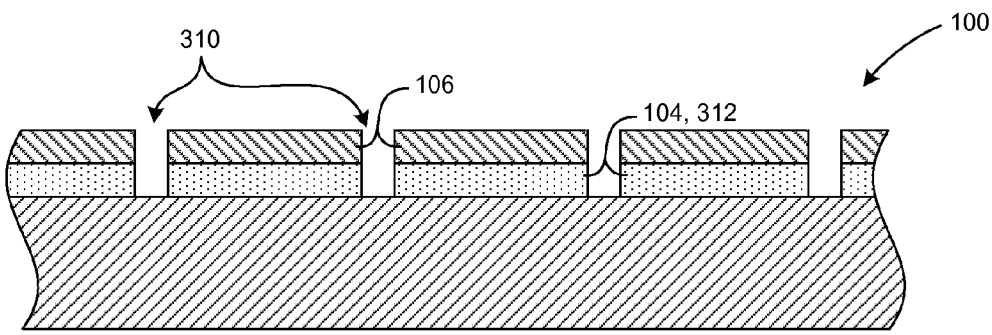
FIG. 3 is a partially schematic, cross-sectional diagram of the device assembly of FIG. 1 having a pattern in accordance with an embodiment of the present technology.
Figure 4:
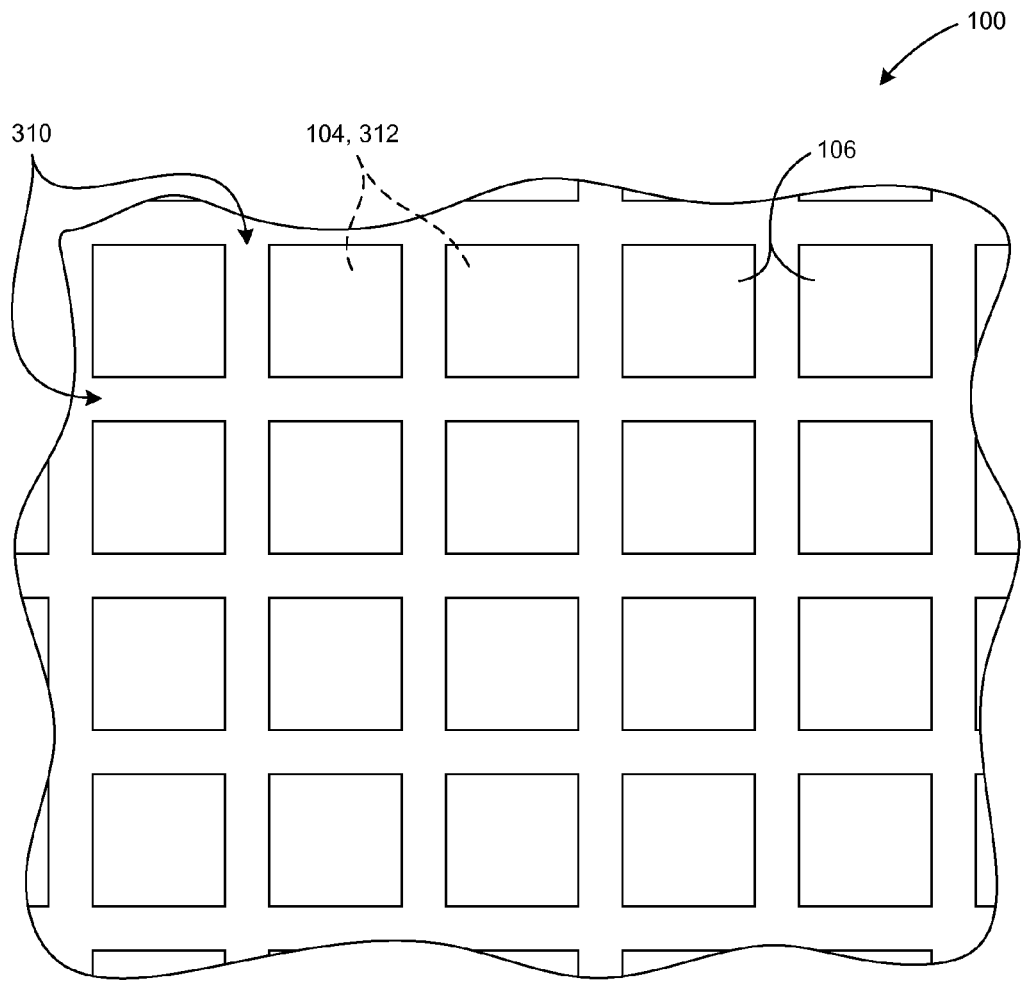
FIG. 4 is a partially schematic, top plan view of the device assembly of FIG. 3.

FIG. 3 is a partially schematic, cross-sectional diagram of the device assembly 100 of FIG. 1 after having been patterned in accordance with an embodiment of the present technology. In the illustrated embodiment, the pattern formed in the device assembly 100 includes a plurality of trenches 310 formed by removing sections of the first bond metal 106 and the transducer structure 104. FIG. 4 is a partially schematic, top plan view of the device assembly 100 of FIG. 3. Referring to FIGS. 3 and 4 together, the trenches 310 can form a grid that separates the transducer structure 104 into a plurality of solid-state transducers ("SSTs") 312. The pattern of the trenches 310 and the SSTs 312 is shaped similarly to an inverted waffle shape, with sections or segments of the trenches 310 surrounding each of the SSTs 312. The trenches 310 can be formed by positioning a mask (not shown) over the areas above the SSTs 312 and etching (e.g., wet etching, dry etching, etc.) the exposed sections of the first bond metal 106 and the transducer structure 104. In other embodiments, the trenches 310 can be formed using other suitable semiconductor fabrication techniques.

Figure 5:
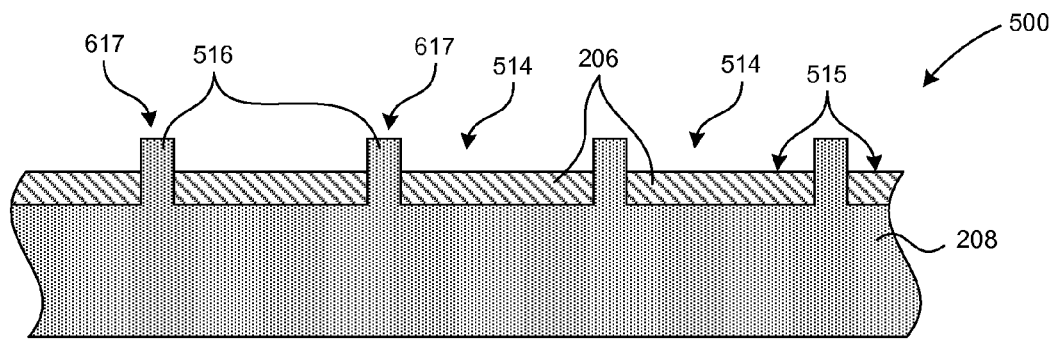
FIG. 5 is a partially schematic, cross-sectional diagram of a patterned carrier assembly configured in accordance with an embodiment of the present technology.
Figure 6:
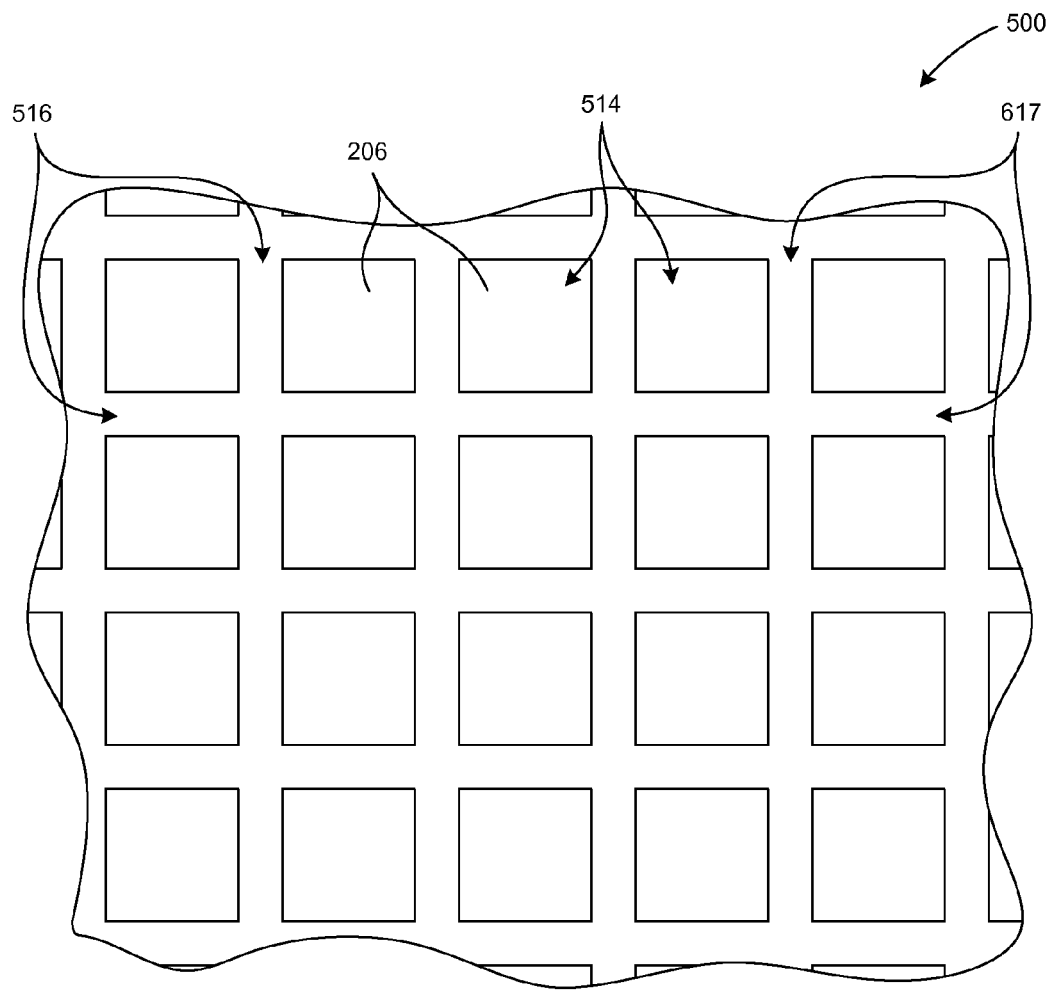
FIG. 6 is a partially schematic, top plan view of the carrier assembly of FIG. 5.

FIG. 5 is a partially schematic, cross-sectional diagram of a patterned carrier assembly 500 having a pattern in accordance with an embodiment of the present technology. In the illustrated embodiment, the pattern in the carrier assembly 500 includes a plurality of intermediate regions (e.g. recesses 514) separated by raised portions or projections 516. FIG. 6 is a partially schematic, top plan view of the carrier assembly 500 of FIG. 5. Referring to FIGS. 5 and 6 together, the recesses 514 and the projections 516 form a waffle pattern with the projections 516 surrounding individual recesses 514 on all sides. As will be described in further detail below, the projections 516 can form dicing streets 617 that can be used to singulate the SSTs 312. In some embodiments, the recesses 514 can be configured to have a depth of from about 5 to about 15 microns. In other embodiments, the depth of the recesses 514 may be smaller or larger than depths included in this range. The recesses 514 can be formed in a manner similar to that used to form the trenches 310 in the device assembly 100. A mask (not shown), for example, can be used to cover the projections 516 of the carrier substrate 208, and exposed sections of the carrier substrate 208 can be etched to form the recesses 514. The recesses 514 can include blind ends 515 at least partially defined by the remaining carrier substrate 208 and/or the second bond metal 206 disposed in the recesses 514 to facilitate bonding with the device assembly 100.

Figure 7:
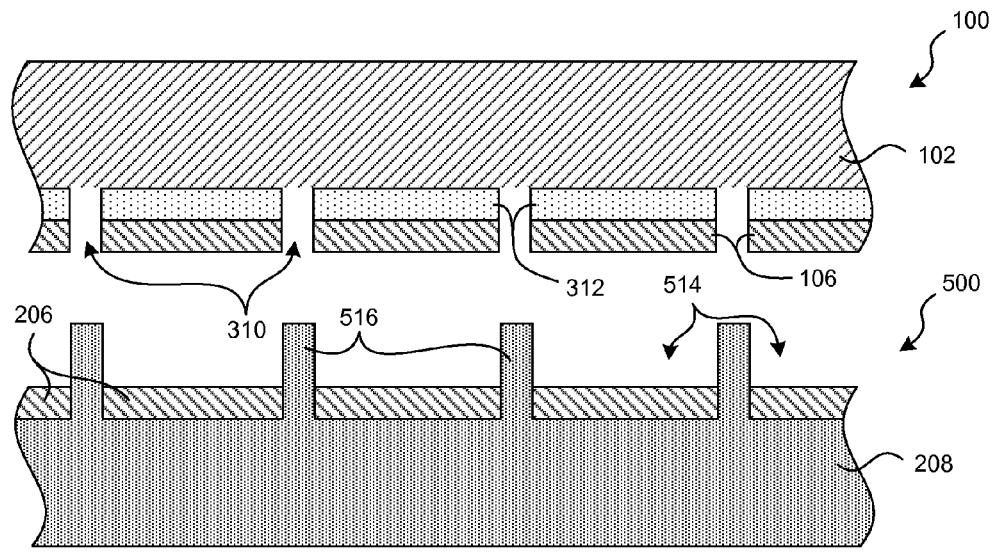
FIG. 7 is a partially schematic, cross-sectional diagram of the device assembly and the carrier assembly of FIGS. 3 and 5 positioned in alignment prior to bonding.

FIG. 7 is a partially schematic, cross-sectional diagram of the device assembly 100 of FIGS. 3 and 4 and the carrier assembly 500 of FIGS. 5 and 6 in alignment prior to bonding. In the illustrated embodiment, the inverted waffle pattern of the device assembly 100 is aligned with the waffle pattern of the carrier assembly 500, prior to bonding. In particular, the projections 516 of the carrier assembly 500 are aligned to be inserted into the trenches 310, while the SSTs 312 with attached sections of the first bond metal 106 are aligned to be inserted into the recesses 514. Optical alignment techniques and/or other semiconductor fabrication techniques can be used to align the device assembly 100 to the carrier assembly 500 in two orthogonal directions, and can be used to position the device assembly 100 and the carrier assembly 500 in parallel planes to facilitate consistent bonds between these assemblies. Additionally, the patterns of the assemblies described herein are created with suitable fabrication tolerances to allow for the assemblies to be mated. For example, the projections 516 may be slightly narrower than the trenches 310 to avoid an interference between these components.

Figure 8:
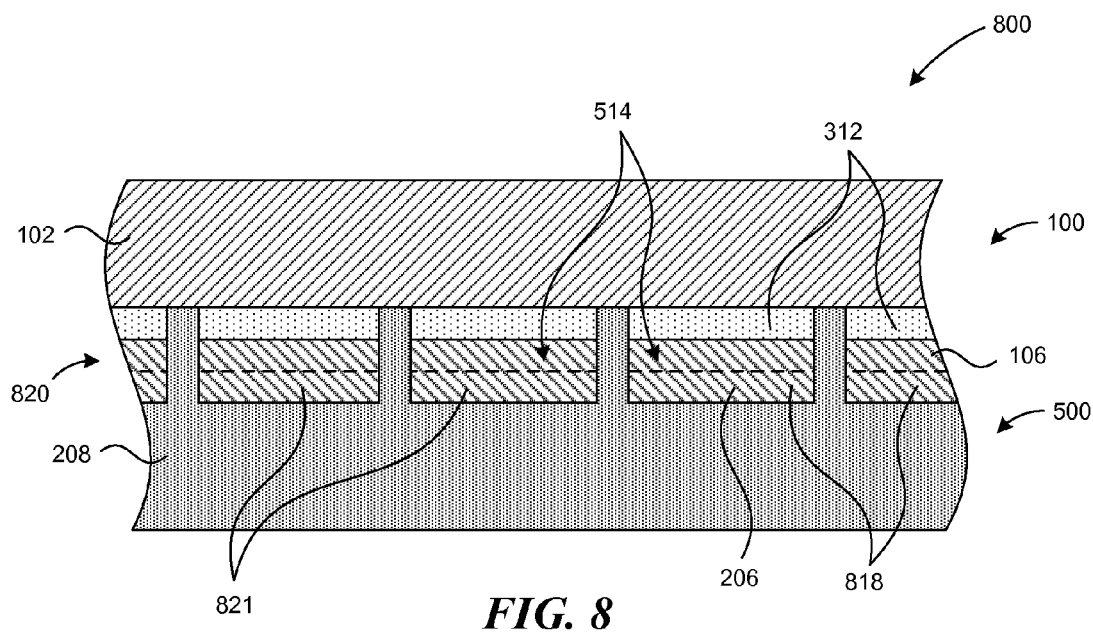
FIG. 8 is a partially schematic, cross-sectional diagram of a bonded assembly configured in accordance with an embodiment of the present technology.

FIG. 8 is a partially schematic, cross-sectional diagram of a bonded assembly 800, including the device assembly 100 and the carrier assembly 500 of FIG. 7, configured in accordance with an embodiment of the present technology. Referring to FIGS. 7 and 8 together, the bonded assembly 800 can be formed by bringing the device assembly 100 and the carrier assembly 500 together after alignment. When the device assembly 100 and the carrier assembly 500 are brought fully together to create the bonded assembly 800, the individual SSTs 312 of the device assembly 100 are contained at least partially within the individual recesses 514 of the carrier assembly 500. The first bond metal 106 of the device assembly 100 and the second bond metal 206 of the carrier assembly 500 combine to form a bond metal structure 818, which bonds the SST's 312 to the recesses 514. The bond metal structure 818 may be formed in a high temperature and pressure environment to facilitate bonding. The resulting bonded assembly 800 includes a discontinuous bond 820 composed of individual bond sections or segments 821 between the SSTs 312 and the bond metal structure 818 in the recesses 514. In particular embodiments, the projections 516 of the carrier assembly 500 that separate the recesses 514 are not bonded to the device assembly 100, and each individual projection 516 represents a discontinuity between the segments 821 of the discontinuous bond 820.

Figure 9:
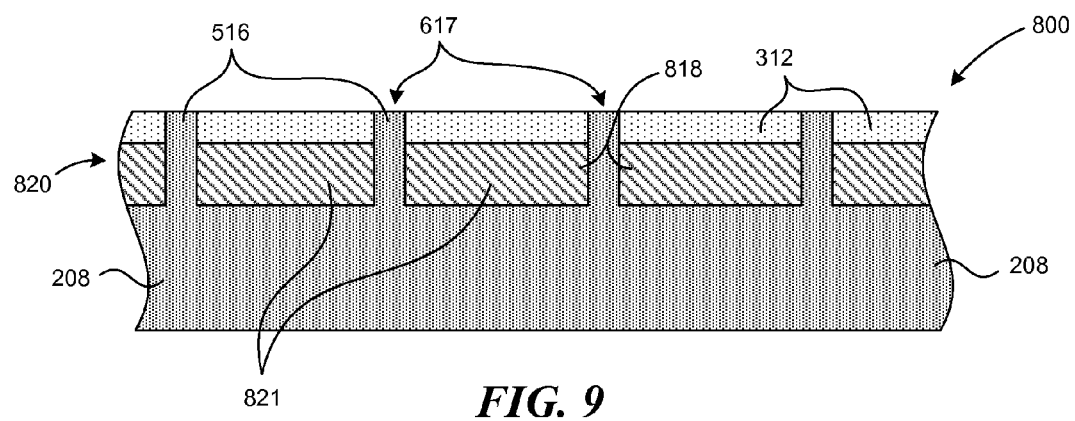
FIG. 9 is a partially schematic, cross-sectional diagram of the bonded assembly of FIG. 8 after the device substrate has been removed in accordance with an embodiment of the present technology.

FIG. 9 is a partially schematic, cross-sectional diagram of the bonded assembly 800 shown in FIG. 8 after the device substrate 102 (not shown in FIG. 9) has been removed in accordance with an embodiment of the present technology. The device substrate 102 may be removed by various semiconductor fabrication techniques including backgrinding, etching, chemical-mechanical planarization and/or other suitable removal methods. After the device substrate 102 has been removed, the bonded assembly 800 includes individual SSTs 312 separated by projections 516. The projections 516 run across the bonded assembly 800, as shown in the overhead view of the carrier assembly 500 in FIG. 6, to form the dicing streets 617. A dicing saw or other singulation tool (not shown in FIG. 9) is then used to cut through the carrier substrate 208 along the dicing streets 617 to singulate the SSTs 312. Dicing the bonded assembly along the streets 617 does not require the saw to singulate through more than one material, e.g., the saw need only cut through the carrier substrate 208. Dicing through a single material can reduce the stresses on the bonded assembly 800 and can limit the potential for misalignments and defects caused by the singulation process. Additionally, the present technology further reduce stresses on the bonded assembly 800 by reducing or eliminating the need to singulate through a high stress bonding material.

Figure 10:
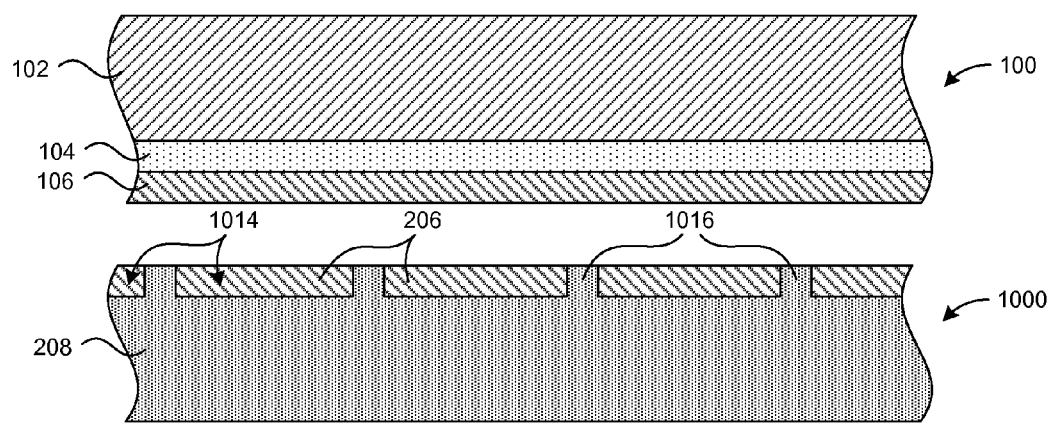
FIG. 10 is a partially schematic, cross-sectional diagram of a device assembly and a carrier assembly prior to formation of a bonded assembly in accordance with an embodiment of the present technology.

FIG. 10 is a partially schematic, cross-sectional diagram of the device assembly 100 of FIG. 1 and a carrier assembly 1000 in alignment prior to bonding in accordance with an embodiment of the present technology. Similar to the carrier assembly 500 of FIGS. 5 and 6, the carrier assembly 1000 includes a plurality of recesses 1014 separated by streets or projections 1016. The recesses 1014 and the projections 1016 form a waffle pattern with the projections 1016 surrounding individual recesses 1014 on all sides. In the illustrated embodiment, the recesses 1014 in the carrier assembly 1000 may be substantially filled with the second bond metal 206 to facilitate bonding with the device assembly 100.

Figure 11:
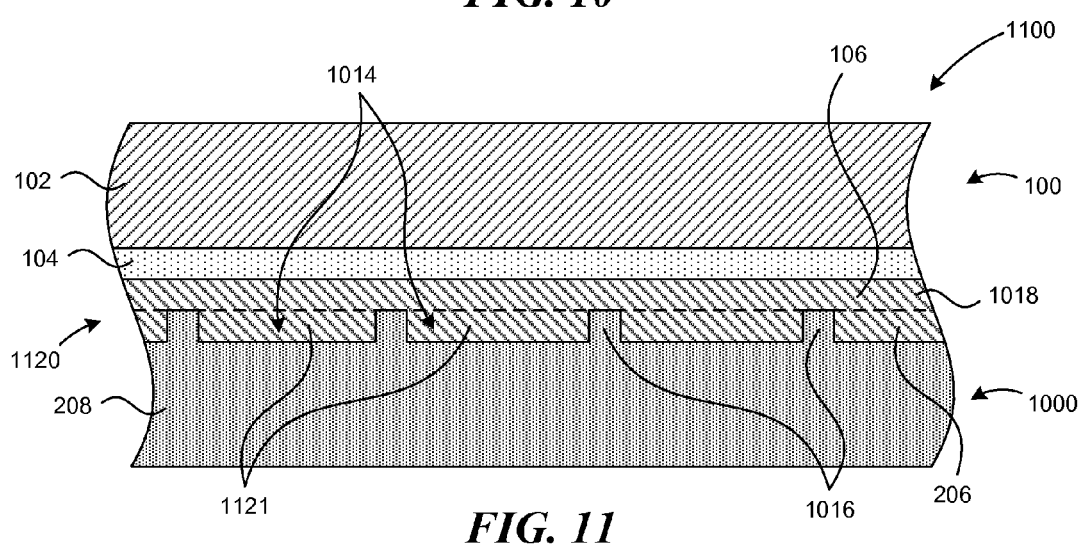
FIG. 11 is a partially schematic, cross-sectional diagram of a bonded assembly configured in accordance with an embodiment of the present technology.

FIG. 11 is a partially schematic, cross-sectional diagram of a bonded assembly 1100 including the device assembly 100 and the carrier assembly 1000 of FIG. 10 configured in accordance with an embodiment of the present technology. Referring to FIGS. 10 and 11 together, after alignment, the device assembly 100 is brought together with and bonded to the carrier assembly 1000. The resulting bonded assembly 1100 includes a bond metal structure 1018 that is formed from the first bond metal 106 of the device assembly 100 and the second bond metal 206 of the carrier assembly 1000. The bond metal structure 1018 bonds the transducer structure 104 of the device assembly 100 to the carrier substrate 208 with a discontinuous bond 1120. The discontinuous bond 1120 includes bond segments 1121 between the transducer structure 104 and the recesses 1014. The projections 1016 of the carrier assembly 1000 are not bonded to the device assembly 100. Accordingly, each individual projection 1016 represents a discontinuity between the bond segments 1121 of the discontinuous bond 1120.

Figure 12:
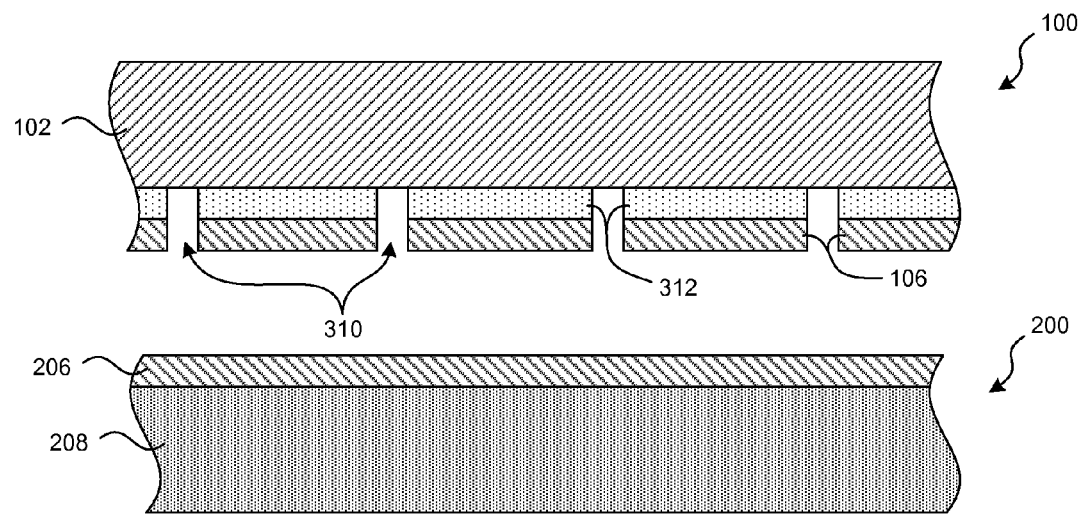
FIG. 12 is a partially schematic, cross-sectional diagram of a device assembly and a carrier assembly prior to formation of a bonded assembly in accordance with another embodiment of the present technology.

FIG. 12 is a partially schematic, cross-sectional diagram of the device assembly 100 of FIGS. 3 and 4 and the carrier assembly 200 of FIG. 2 in alignment prior to bonding. As previously discussed, the trenches 310, and the SSTs 312 define an inverted waffle shape, with sections of the trenches 310 surrounding each of the SSTs 312.

Figure 13:
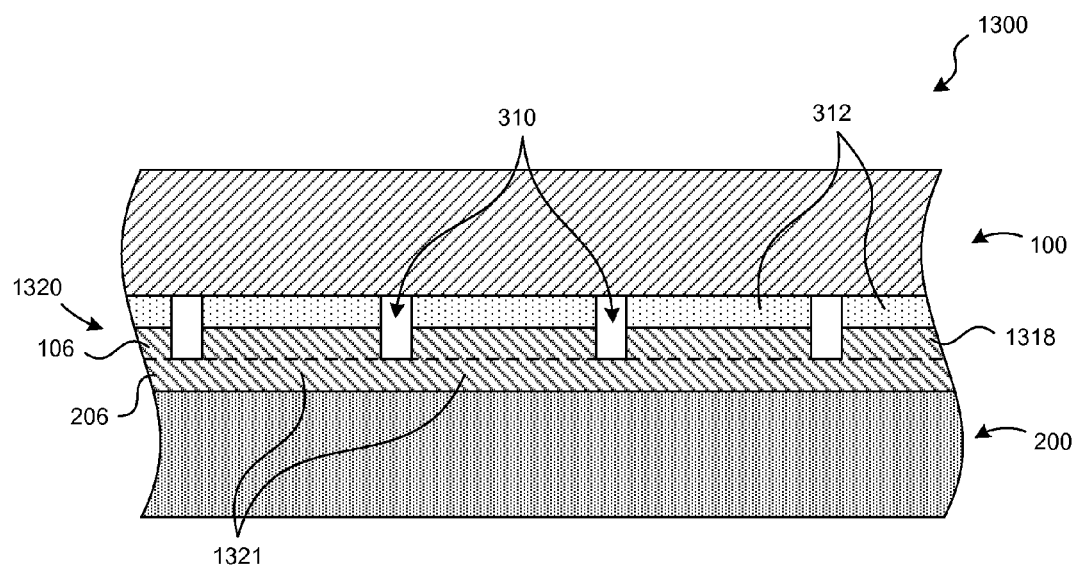
FIG. 13 is a partially schematic, cross-sectional diagram of a bonded assembly configured in accordance with an embodiment of the present technology.

FIG. 13 is a partially schematic, cross-sectional diagram of a bonded assembly 1300 including the device assembly 100 and the carrier assembly 200 of FIG. 12 configured in accordance with an embodiment of the present technology. As shown in FIG. 13, the device assembly 100 and the carrier assembly 200 can be aligned and brought together to form the bonded assembly 1300. Bonding the device assembly 100 with the carrier assembly 200 combines the first bond metal 106 with the second bond metal 206 to form a bond metal structure 1318. Accordingly, the SSTs 312 of the device assembly 100 are bonded to the carrier assembly 200 with the bond metal structure 1318. In the illustrated bonded assembly 1300, the trenches 310 (or at least portions of the trenches 310) remain open, forming a void or gap. The bonded assembly 1300 thereby includes a discontinuous bond 1320 composed of bond segments 1321 between the SSTs 312 and the carrier assembly 200. The trenches 310 that separate the SSTs 312 represent a discontinuity between the bond segments 1321 of the discontinuous bond 1320.

Conventional semiconductor fabrication techniques typically produce significant stresses across wafers that can cause the wafers to bow or warp. This in turn can cause the wafer components to separate and/or become misaligned, potentially creating immediate or delayed defects in the components. These negative effects can be especially pronounced in larger wafers in which stresses can build up over larger distances. In contrast to the foregoing conventional techniques, the discontinuous bonds of the present disclosure decrease the mechanical stress across the bonded assemblies. As discussed above, in the bonded assembly 800, for example, the projections 516 of the carrier assembly 500 are not bonded to the device assembly 100, and the projections 516 represent discontinuities in the discontinuous bond 820. The discontinuities can decrease stress across the bonded assembly 800 and reduce or eliminate bowing and warping. The bonded assemblies 1100 and 1300 include similar stress reducing discontinuous bonds. Accordingly, the bonded assemblies of the present disclosure can be constructed on larger substrates because the lower stresses produce smaller amounts of bowing and warping for a given size substrate. In one embodiment, for example, the bonded assemblies can be constructed on eight inch diameter substrates. These larger wafers produce economies of scale not available with smaller wafers. Although the advantages of the systems and methods of the present technology may be more pronounced with larger diameter substrates, the advantages may also be present in smaller substrates. Accordingly, in other embodiments, the bonded assemblies may be constructed on smaller diameter substrates as well as larger diameter substrates.

A further advantage of embodiments of the present technology is that the second bond metal 206 can be contained during the fabrication process. The recesses 514, for example, can contain the second bond metal 206 within the projections 516. By containing the second bond metal 206 within the recesses 514, the distribution of the second bond metal 206 can be limited to only areas where it is needed for bonding. Accordingly, the second bond metal 206 can be prevented from migrating to other areas of the carrier assembly 500, and either interfering with other components (which can cause defects, such as short circuits), or creating waste by migrating to areas not used for bonding. By reducing defects and waste, systems and methods in accordance with embodiments of the present disclosure increase the efficiency and throughput with which SSTs and/or other semiconductor devices are manufactured.

From the foregoing it will be appreciated that specific embodiments of the disclosed technology have been described herein for purposes of illustration, but that various modifications may be made without deviating from the disclosure. For example, carrier assemblies, device assemblies and bonded assemblies disclosed herein can include trenches, patterned recesses, and/or projections with different sizes and/or shapes. Rectangular recesses and SSTs, for example, may be used in some embodiments. Additionally, different materials may be used in place of those described herein, or additional components may be added or removed. For example, a bonding material may be applied to only one of either the carrier assembly or the device assembly prior to bonding. In particular embodiments the trenches surround a single SST. In other embodiments, the smallest region enclosed by the trenches can include multiple SSTs. Such a technique can be used, for example, in instances for which grouping multiple SSTs together without a bond discontinuity does not create an unacceptable warping and/or other effects, and/or instances for which the SSTs remain together as a functional unit after dicing. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure and associated technology can encompass other embodiments not expressly shown or described herein.

We claim:

1. A bonded assembly, comprising:
a device substrate carrying a plurality of solid-state transducers and a first bond metal, wherein the device substrate includes a plurality of trenches separating individual solid-state transducers from one another, and wherein the plurality of trenches separate the first bond metal into a plurality of sections, with individual sections of the first bond metal positioned in contact with corresponding individual solid-state transducers; and
a carrier substrate carrying a second bond metal, wherein the second bond metal is bonded to the first bond metal via a discontinuous bond, and wherein the second bond metal extends uninterrupted across multiple individual trenches separating corresponding solid-state transducers.

2. The bonded assembly of claim 1 wherein the discontinuous bond includes a plurality of bond segments, individual bond segments comprising individual sections of the first bond metal bonded to corresponding individual sections of the second bond metal.

3. The bonded assembly of claim 1 wherein the plurality of trenches include void space between neighboring solid-state transducers.

4. The bonded assembly of claim 1 wherein the plurality of trenches include gaps between the device substrate and the second bond metal.

5. The bonded assembly of claim 1 wherein the plurality of trenches include discontinuities in the discontinuous bond.

6. The bonded assembly of claim 1 wherein the second bond metal extends uninterrupted across the carrier substrate.

7. The bonded assembly of claim 1 wherein the plurality of solid-state transducers and the plurality of trenches form an inverted waffle pattern.

8. The bonded assembly of claim 1 wherein the plurality of solid-state transducers comprise light-emitting diodes.

9. A semiconductor device, comprising:
a device assembly including:
a first substrate,
a plurality of solid-state transducers positioned on the first substrate, wherein individual solid-state transducers are separated from one another by a plurality of trenches forming a grid pattern, and
a plurality of sections of a first bond metal, wherein individual sections of the first bond metal are attached to corresponding individual solid-state transducers, and wherein the individual solid-state transducers are positioned between the first substrate and corresponding individual sections of the first bond metal; and
a carrier assembly including:
a second substrate, and
a second bond metal attached to the second substrate, wherein the second bond metal extends uninterrupted across multiple individual trenches separating corresponding solid-state transducers, and wherein the second bond metal is bonded to the plurality of sections of the first bond metal to form a discontinuous bond.

10. The semiconductor device of claim 9 wherein the plurality of trenches include voids positioned between the first substrate and the second bond metal.

11. The semiconductor device of claim 10 wherein the voids include discontinuities in the discontinuous bond.

12. The semiconductor device of claim 9 wherein the plurality of solid-state transducers comprise light-emitting diodes.

13. The semiconductor device of claim 9 wherein the trenches extend from the first substrate to the second bond metal.

14. The semiconductor device of claim 9 wherein the first bond metal and the second bond metal form a bond metal structure, and wherein the plurality of trenches form a grid pattern in the bond metal structure.

15. A semiconductor device, comprising:
a carrier substrate having a plurality of projections, the plurality of projections forming a grid pattern and defining a plurality of recessed portions; and
a device substrate carrying a plurality of solid-state transducers, wherein the device substrate is bonded to the carrier substrate via a bond metal forming a discontinuous bond, wherein individual solid-state transducers are positioned within corresponding individual recesses of the carrier substrate, and wherein the discontinuous bond comprises a plurality of bond segments, individual bond segments bonding corresponding individual solid-state transducers to the carrier substrate.

16. The semiconductor device of claim 15 wherein individual solid-state transducers are separated from one another by a plurality of trenches forming a grid pattern, and wherein the plurality of projections are positioned within the plurality of trenches.

17. The semiconductor device of claim 15 wherein the plurality of projections are positioned adjacent to the device substrate.

18. The semiconductor device of claim 15 wherein individual projections are positioned between corresponding individual bond segments.

19. The semiconductor device of claim 15 wherein individual bond segments are positioned within corresponding individual recesses and are enclosed by corresponding projections, by the carrier substrate, and by corresponding solid-state transducers.

20. The semiconductor device of claim 15 wherein the plurality of solid-state transducers are rectangular, and wherein individual solid-state transducers are adjacent to corresponding projections on four sides.

* * * * *